(12) United States Patent
Satoh

(10) Patent No.: US 6,435,798 B1
(45) Date of Patent: Aug. 20, 2002

(54) SEMICONDUCTOR PROCESSING APPARATUS WITH SUBSTRATE-SUPPORTING MECHANISM

(75) Inventor: Kiyoshi Satoh, Tama (JP)

(73) Assignee: ASM Japan K.K., Tama (JP)

( * ) Notice: Subject to any disclaimer, the term of this patent is extended or adjusted under 35 U.S.C. 154(b) by 0 days.

(21) Appl. No.: 09/544,764

(22) Filed: Apr. 7, 2000

(30) Foreign Application Priority Data

Apr. 9, 1999 (JP) .......................................... 11-103137

(51) Int. Cl.[7] .............................................. B65G 49/07
(52) U.S. Cl. ........................ 414/217; 414/941; 118/728; 118/729
(58) Field of Search ................................ 414/217, 941; 118/728, 729

(56) References Cited

U.S. PATENT DOCUMENTS 5,421,893 A * 6/1995 Perlov ..................... 118/729 X
5,611,865 A * 3/1997 White et al. ............. 118/728 X
6,148,762 A * 11/2000 Fukuda et al. .......... 118/728 X
6,168,668 B1 * 1/2001 Yudovsky ............... 118/728 X

* cited by examiner

Primary Examiner—Steven A. Bratlie
(74) Attorney, Agent, or Firm—Knobbe, Martens, Olson & Bear, LLP

(57) ABSTRACT

A semiconductor processing apparatus for processing a semiconductor substrate includes: (i) a vacuum-exhausted chamber; (ii) a susceptor which is provided within the chamber and which holds the substrate and has at least three through-holes; (iii) substrate-supporting members which are supported within the through-holes and which support the substrate; (iv) a pin, one end of which is inserted into the inner part of a the substrate-supporting member; and (v) a pin-fixing structure provided at the base of the chamber for fixing the other end of the pin. When the susceptor moves downward, the pin pushes up the substrate-supporting member, and the substrate is supported in midair by the substrate-supporting members apart from the susceptor.

20 Claims, 9 Drawing Sheets

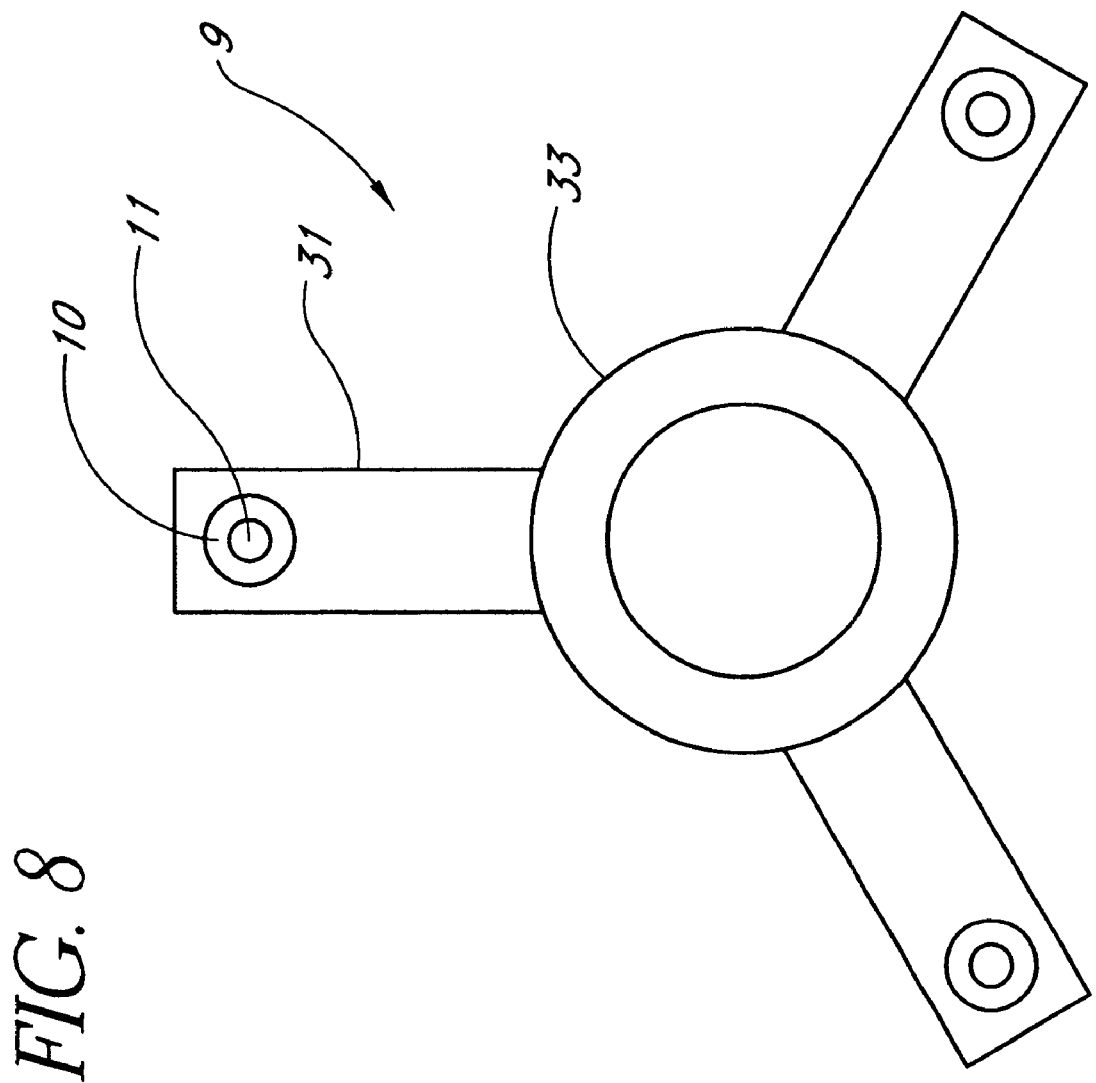

SEMICONDUCTOR PROCESSING APPARATUS WITH SUBSTRATE-SUPPORTING MECHANISM

BACKGROUND OF THE INVENTION

1. Field of the Invention

The present invention relates to a plasma CVD apparatus for processing a semiconductor substrate, and particularly it relates to a semiconductor substrate-supporting mechanism for supporting a semiconductor substrate which is loaded on a susceptor in mid-air when the substrate is conveyed.

2. Description of the Related Art

Conventional substrate processing apparatuses comprise a plasma reaction chamber, a load lock chamber where multiple wafer substrates are loaded on a cassette board and held, and a substrate transfer chamber with a substrate-conveying mechanism to link both the plasma chamber and the load lock chamber.

Semiconductor substrates are carried into and carried out of the reaction chamber by a reciprocating blade which is mounted at the tip of the arm of said substrate-conveying mechanism between the load lock chamber and the reaction chamber. To prevent moisture in the atmosphere and particle contamination, each chamber is separated by a gate valve and continuously vacuum-exhausted, and each gate valve of each of the chambers is set to open only when a semiconductor substrate is conveyed.

To lift a semiconductor substrate loaded on a susceptor within the reaction chamber by a blade, a space for inserting the blade between the semiconductor wafer and the susceptor is necessary. In the case of the conventional apparatus, multiple through-holes are provided for the susceptor and the apparatus has a structure in which a pin is inserted into this through-hole, the tip of the pin moves out and in from the susceptor surface with an up-and-down (vertical) movement of the susceptor. This pin protrudes from the susceptor at the time of transfer to suspend a semiconductor wafer in mid-air, and it is completely seated within the susceptor at the time of processing.

There are two types of this conventional method of supporting a semiconductor substrate with a pin.

One method is a type to fix one end of the pin to the base of a reaction chamber. Another is a method in which the pin is supported and suspended within the through-hole of the susceptor. The latter type is mainly used with a rotatable type of susceptor apparatus. As the susceptor descends and moves, one end of the pin contacts a pad provided at the reaction chamber base, and the pin stands upright on the pad and supports a semiconductor substrate through the through-hole.

SUMMARY OF THE INVENTION

The above-mentioned two conventional methods of supporting a semiconductor substrate with a pin are faulty in the following points: First, in the case of a lower-end fixed type in which one end of the pin is fixed at the reaction chamber base, a position of height direction of the tip of the pin has to be determined exactly for the following reasons: the height of the pin from the susceptor surface at the time of transfer must be sufficient to receive the blade. If the tip of the pin is not completely seated within the through-hole at reaction processing, the semiconductor substrate does not fully contact the susceptor and is partly suspended in mid-air. If the pin protrudes from the susceptor surface when plasma cleaning of the reaction chamber is performed, there is the further possibility of generating an arc due to the concentration of discharged energy on the pin. This arc causes serious damage not only to the pin but also to the showerhead surface. If the pin is retracted considerably, plasma discharge concentrates on the lip portion of the through-hole as well and damages a protective coat or coating film of a showerhead surface that faces the portion. This creates a risk that these films that thus come off and scatter inside the reaction chamber and cause impurity contamination. Similarly in the state where the pin is retracted considerably from the susceptor surface within the through-hole, active species caused by plasma discharge furthermore forces its way into the inner part of the susceptor device and damages the susceptor, a heater set up below it, the pin, and its fixing structure.

In this way, in the case of the conventional lower-end fixed type devices, the position of a height direction of the pin tip has to be exactly determined, and work time, therefore, becomes longer.

Additionally, because the pin has as conventionally been manufactured of aluminum alloy, its length changes with thermal expansion. Height adjustment at actual temperature used (200~300° C. (392~572° F.)) is very risky and difficult. Furthermore, at a temperature of 300~400° C. (572~752° F.), the mechanical strength of the pin deteriorates and it is also insufficient to support a wafer with a large diameter (300 mm). For this reason, the pin deforms in the consecutive processes of supporting the wafer. As this happens, device down time required for replacement of expendables becomes longer. As a result, yield and productivity drop.

In the case of a suspension type wherein a pin is accommodated within a through-hole of a susceptor, to receive a thick blade when supporting a 300 mm wafer with high weight, a distance that the pin protrudes from the susceptor surface becomes longer and support becomes unstable.

Further, this pin is electrostatically attracted to the backside of a semiconductor wafer which has been plasma processed and electrically charged, and there is a risk that the pin is supported with the wafer when the wafer is conveyed. In this case, the pin will drop during transfer of the wafer due to impact from a transfer robot. As a result, it is damaged and this causes particle contamination.

Consequently, an object of the present invention is to provide a substrate-supporting mechanism for which pin height can be adjusted easily.

Another object of the present invention is to provide a substrate-supporting mechanism for which replacement of expendables such as pins is easy.

A further object of the present invention is to provide a substrate-supporting mechanism that can stably support a semiconductor substrate with a large diameter.

An additional object of the present invention is to provide a substrate-supporting mechanism for which the tip portion of the pin is not electrostatically attracted to the backside of a semiconductor wafer.

To achieve one or more of the above-mentioned objects, the present invention provides an apparatus for processing a semiconductor substrate, comprising: (a) a reaction chamber; (b) a susceptor within the chamber for supporting a substrate thereon when processed, said susceptor having at least three vertical through-holes at designated positions; (c) substrate-supporting members slidably fitted in the respective through-holes, each substrate-supporting member having an upper end and a lower end, each substrate-supporting member being reciprocally slidable along the through-hole between an upper position where the upper end protrudes from the susceptor and a lower position where the upper end does not protrude from the susceptor, wherein when the substrate-supporting members are at the upper position, the substrate is supported apart from the susceptor by the upper ends of the substrate-supporting members; and (d) pins corresponding to the respective substrate-supporting member, each pin having an upper end pushing upward the substrate-supporting member to move the substrate-supporting member to the upper position, where the upper end of the pin and the lower end of the substrate-supporting member are detachably fitted to restrict further upward movement of the substrate-supporting member, each pin being retracted downward to detach the upper end of the pin from the substrate-supporting member positioned at the lower position.

In an embodiment, the pins are fixed in the chamber, and the susceptor is vertically movable to move the substrate-supporting members between the upper position and the lower position. In the above, a moving device for mechanically moving the susceptor vertically may be provided. In another embodiment, a pin-fixing structure is provided at a base of the chamber, wherein each pin has a lower end fixed to the pin-fixing structure.

The present invention can equally be adapted to a method for processing a substrate using the above-mentioned apparatus. The method may comprise: (i) loading a substrate in the reaction chamber, wherein the substrate is supported apart from the susceptor by the substrate-supporting members at the upper position; (ii) moving downward the substrate-supporting members to the lower position by movement of the pins relative to the susceptor, wherein the substrate is placed on the susceptor; (iii) processing the substrate; (iv) moving upward the substrate-supporting members to the upper position by movement of the pins relative to the susceptor, wherein the substrate is supported apart from the susceptor by the substrate-supporting members at the upper position; and (v) unloading the processed substrate from the chamber.

In the above, in an embodiment, the method further comprises cleaning the chamber when the substrate-supporting members are at the lower position. In another embodiment, the vertical movement of the substrate-supporting members relative to the susceptor is conducted by vertically moving the susceptor whereas the pins are held still.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

FIG. 8 is a plan view showing a pin-fixing structure according to the present invention.

DETAILED DESCRIPTION OF THE PREFERRED EMBODIMENT

Figure 1:
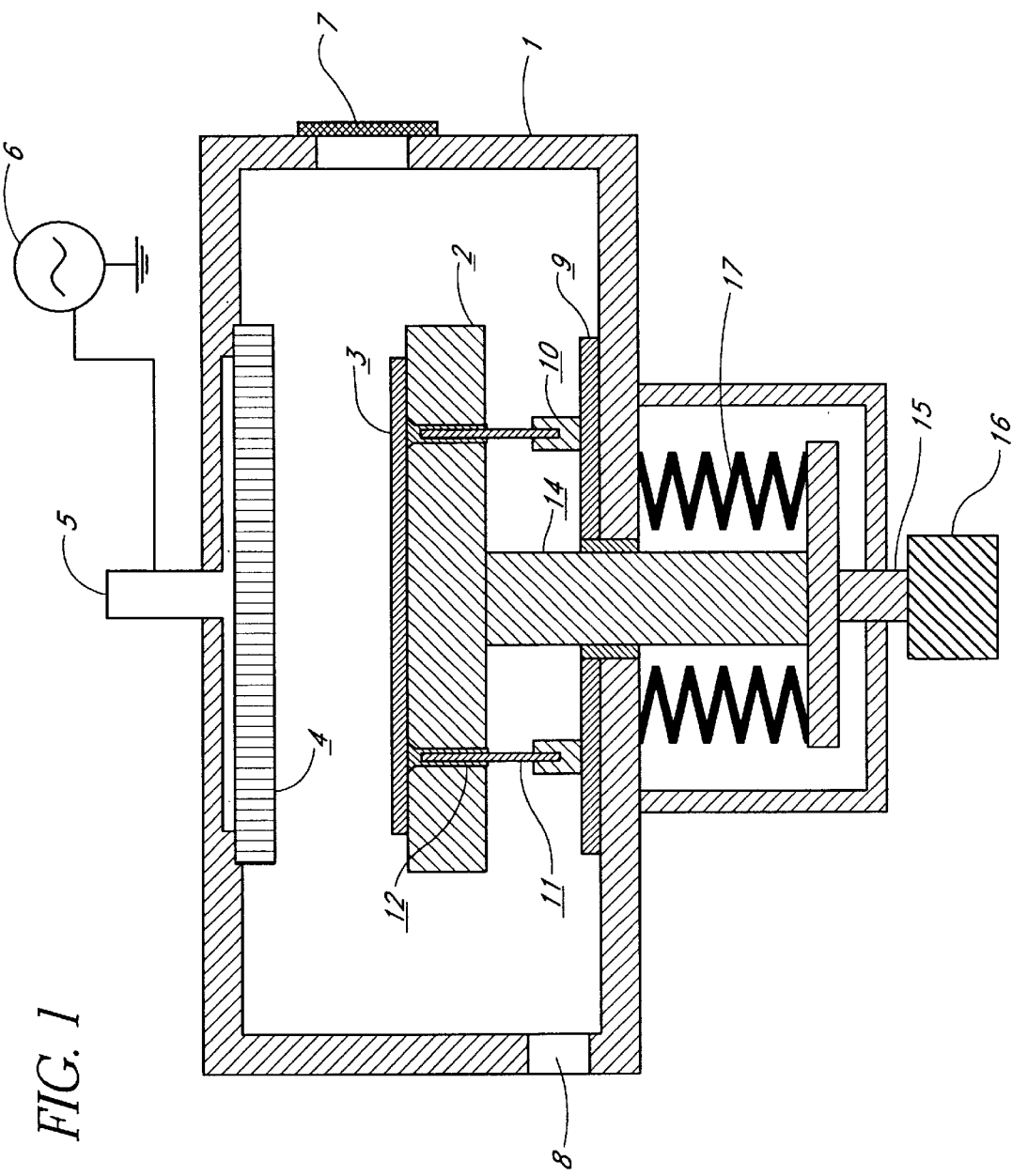
FIG. 1 is a schematic cross-sectional view showing a semiconductor processing apparatus according to the present invention.

In an embodiment of the present invention, a semiconductor processing apparatus for processing a semiconductor substrate comprises: (i) a vacuum-exhausted chamber; (ii) a susceptor which is provided within the chamber and which holds the semiconductor substrate and has at least three through-holes; (iii) substrate-supporting members which are supported within the respective through-holes when the semiconductor substrate is processed or when the chamber is cleaned, and which supports the semiconductor substrate when the semiconductor substrate is carried in or carried out; (iv) pins, one end of each pin being inserted into the inner part of the substrate-supporting member; and (v) a pin-fixing structure provided at the base of the chamber for fixing the other end of the pin; wherein when the susceptor moves downward, the pin pushes up the substrate-supporting member, and the semiconductor substrate is supported in mid-air by at least three the semiconductor supporting members apart from the susceptor.

The present invention can include one or more of the following various embodiments:

(1) The substrate-supporting member has a flanged head member and a cylindrical body, one end of the body is open to receive one end of the pin and the other end of the body is closed to contact with one end of the pin.

(2) The head member comprises a conical upper portion and reverse-truncated cone-shaped lower portion.

(3) An upper opening circumference portion of the through-hole of the susceptor is beveled at the same angle as a curved surface of the lower portion of the substrate-supporting member, wherein the opening circumference portion and the curved surface of the lower portion engage each other leaving no space between them and the substrate-supporting member is supported by the opening circumference portion, the tip of the substrate-supporting member does not protrude from the susceptor surface.

(4) One end of the pin is conical and a contact surface of the substrate-supporting member forms a concave member whose shape is conical and the same shape as one end of the pin.

(5) The pin-fixing structure comprises: a fixed base member and a pin holder.

(6) The fixed base member comprises: a center cylindrical member; and at least three blades which radiate in all directions at equal intervals from the upper-end rim of the cylindrical member and threaded holes for receiving the pin holder are formed around each end of the blades.

(7) The pin holder comprises a fine-cavity for receiving the pin, and a threaded screw member to be screwed into the hole of the blade.

(8) The apparatus further has a moving mechanism for mechanically moving the susceptor vertically.

(9) The moving mechanism and the chamber are completely separated by means of bellows.

(10) A substrate-supporting member, pins, and a pin-fixing structure are made of a material that excels in heat resistance with a small coefficient of thermal expansion.

(11) The material is ceramic.

(12) The material is aluminum oxide, aluminum nitride, or magnesium oxide.

The present invention will be explained with reference to the figures showing embodiments of the present invention.

Figure 2A:
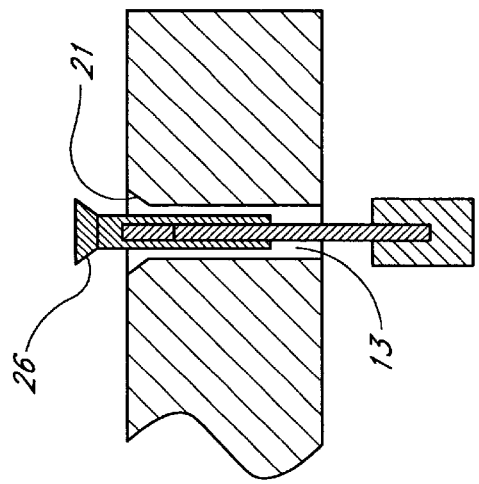
FIGS. 2a, 2b, and 2c are partially enlarged cross-sectional views showing a substrate-supporting mechanism according to the present invention.
Figure 2B:
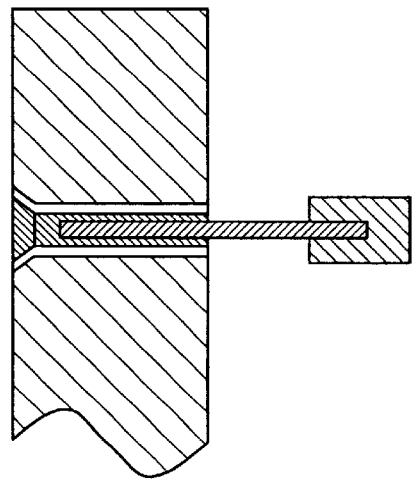
Figure 2C:
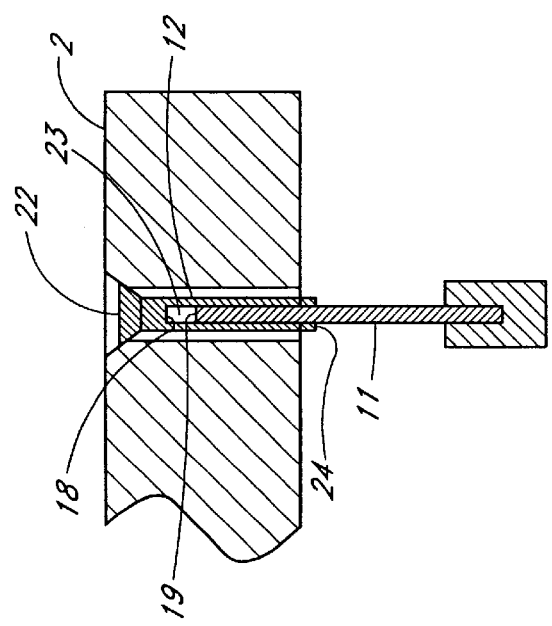
Figure 3:
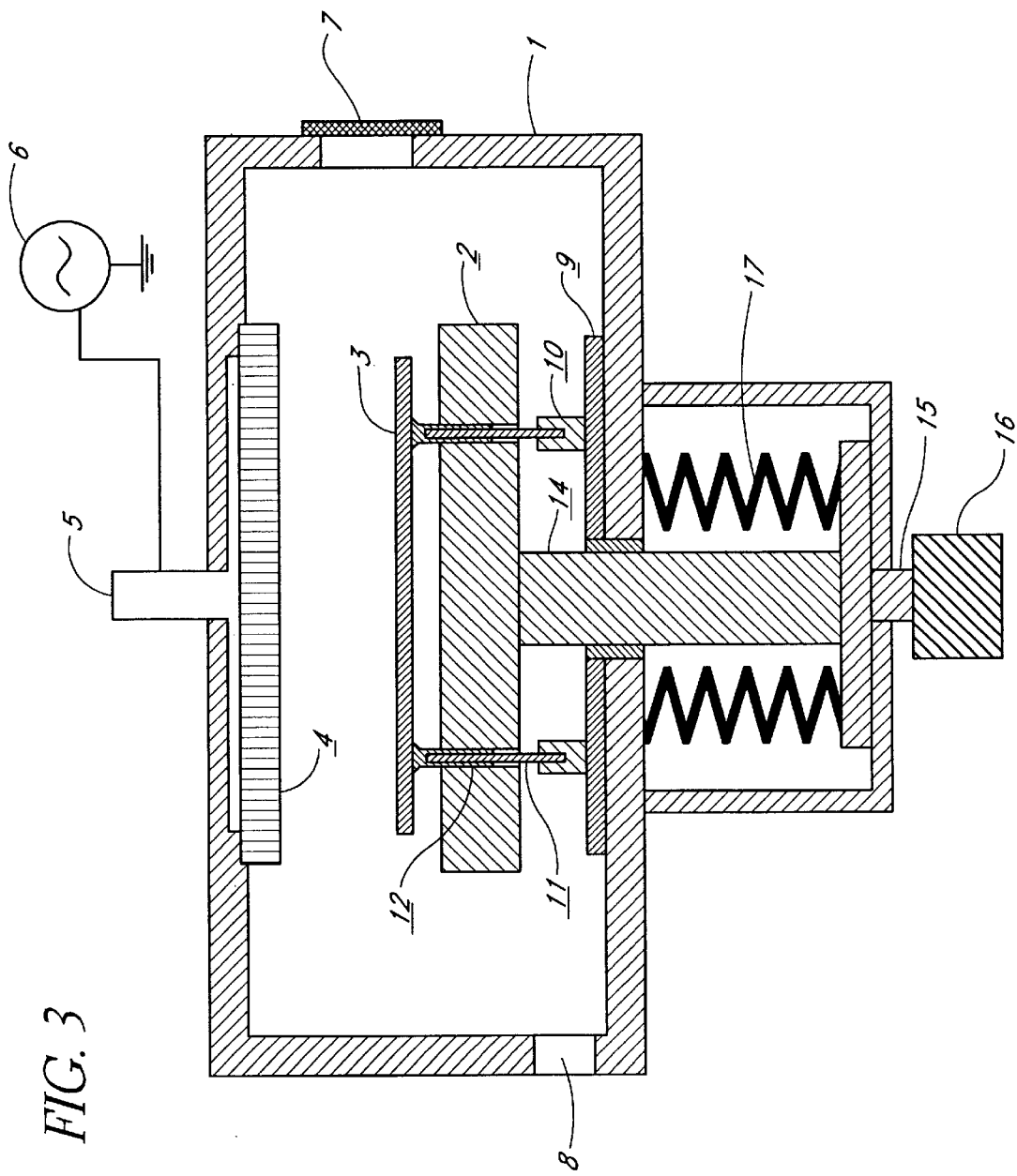
FIG. 3 is a schematic cross-sectional view showing a semiconductor processing apparatus when the processing is completed within the semiconductor processing apparatus according to the present invention.

FIGS. 1–3 illustrate the operation of a semiconductor substrate-supporting mechanism, particularly, the wafer carrying-out process, according to the present invention. FIG. 1 is a view of an apparatus at the time of plasma treatment reaction. FIG. 2a is an enlarged view of the substrate-supporting mechanism at that time.

FIG. 2a shows a structure where a susceptor 2 positions at the highest point. A substrate-supporting member 12 is inserted in a through-hole 13 of the susceptor 2, and as explained more in detail later, the lower curved surface 26 of the substrate-supporting member 12 engages with the beveled lip portion 21 of the through-hole 13 and with this, the tip 22 of the substrate-supporting member 12 is supported at a height lower than the susceptor surface. Inside the substrate-supporting member 12, a cavity 23 with an opening 24 is provided and from this opening 24, a pin 11 is inserted. In the structure shown in FIG. 2a, the tip 19 of the pin 11 is separated from a contact surface 18 of the cavity 23. Consequently, there is no possibility that a semiconductor wafer is pushed upward from the surface of the susceptor 2 during plasma processing, and there is no possibility that the discharge is concentrated on the substrate-supporting member 12 at the time of plasma cleaning. There is no need for troublesome pin height adjustment.

The susceptor 2 then moves downward to the position that is shown in FIG. 2b. Before the tip 19 of the pin 11 contacts and pushes the contact surface 18 within the cavity 23 of the substrate-supporting member 12, the lower curved surface 26 of the substrate-supporting member 12 is in contact with the susceptor 2. When the tip 19 of the pin 11 contacts the contact surface 18 within the cavity 23, the pin 11 begins pushing the substrate-supporting member 12. In this figure, the substrate-supporting member 12 is still supported by the lip portion 21 of the through-hole 13.

Lastly, the susceptor 2 moves to the lowest point that is shown in FIG. 2c. At this time, engagement of the substrate-supporting member 12 and the lip portion 21 is released and the substrate-supporting member 12 is lifted up by the pin 11. The tip 22 of the substrate-supporting member 12 protrudes upward from the surface of the susceptor 2 by a designated distance (10~20 mm) and supports the semiconductor wafer 3 in midair as shown in FIG. 3. A blade (approximately 5 mm thick) of an auto-transfer mechanism robot (not shown) is inserted into a space formed in this way between the susceptor 2 and the semiconductor substrate 3, and the semiconductor wafer 3 is lifted by this blade. Subsequently, the semiconductor wafer 3 is carried out from a reaction chamber to a load lock chamber and is loaded to a wafer cassette.

The carrying-in process of semiconductor substrates is the opposite of the above-mentioned carrying-out process. The auto-transfer mechanism robot carries in a new unprocessed wafer on the blade from the load lock chamber into the reaction chamber, conveys it onto protruded substrate-supporting member 12 and then slowly moves it down. This unprocessed wafer supported on the substrate-supporting member 12 is loaded on the susceptor 2 when the susceptor slowly rises and reaches its highest point (FIG. 2a).

Figure 4:
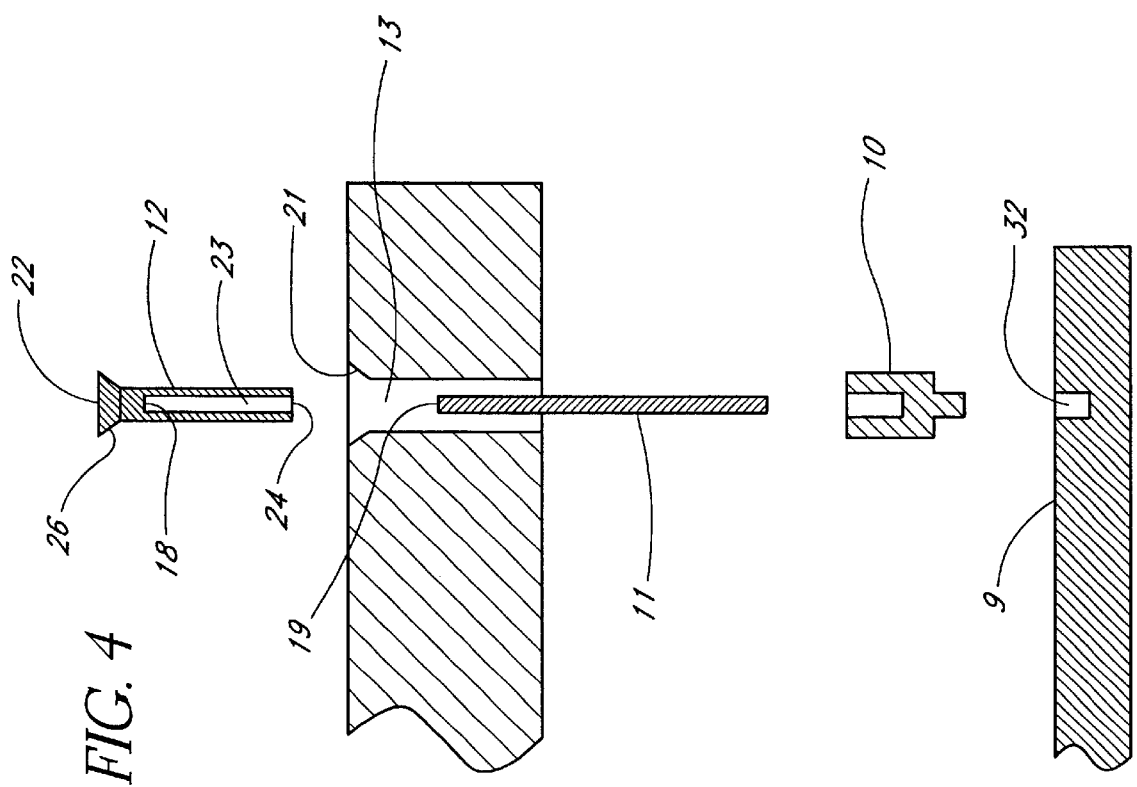
FIG. 4 is a partially enlarged cross-sectional view showing disassembled structures of a substrate-supporting mechanism within a semiconductor processing apparatus according to the present invention.

The present invention is explained while referring to the figures in the following: Referring to FIG. 1 and FIG. 4, a semiconductor processing apparatus for processing a semiconductor substrate according to the present invention comprises a vacuum-exhausted chamber 1, a susceptor 2 which is provided within this chamber and which holds a semiconductor substrate 3 and has at least three through-holes 13, a substrate-supporting members 12 which is supported within the through-holes when the semiconductor substrate is processed or when the chamber is cleaned, and which supports the semiconductor substrate when the semiconductor substrate is carried in or carried out, a pin 11, one end of which is inserted into the inner part of the substrate-supporting member 12, and a pin-fixing structure (9, 10) provided at the base of the chamber 11 for fixing the other end of the pin 11, wherein by moving the susceptor 2 downward, the pin pushes up said substrate-supporting member 12 and the semiconductor substrate 3 is supported in mid-air by at least three of the semiconductor supporting members 12 apart from the susceptor 2.

The susceptor 2 that directly holds the semiconductor substrate 3 to be processed has at least three through-holes 13 arranged at equal intervals on the circumference a designated radius distance away from the center. The lip portion 21 of the through-hole 13 is beveled as explained later in detail. The susceptor is made of aluminum nitride ceramic with approximately 200~400 mm in diameter and 10~80 mm in thickness and containing molybdenum or tungsten mesh as a radio frequency electrode, metal sheath-heater and a tungsten heating element or SiC heating element as a heating element are buried.

As explained later in detail, the substrate-supporting member 12 comprises a flanged head member and a cylindrical body to lift the semiconductor wafer 3. The substrate-supporting member is inserted within the through-hole 13 of the susceptor and is supported by the lip portion 21 of the through-hole 12. The inner part of the body of the substrate-supporting member 12 has a cavity 23 and a lower end 24 is open. The substrate-supporting member 12 is made of a ceramic material with a relatively small coefficient of thermal expansion such as aluminum oxide (aluminum ceramic) or aluminum nitride and preferably it is made of alumina oxide with high resistance to fluorine active species.

One end of the pin 11 for lifting the substrate-supporting member 12 is inserted in the body inner part from the opening portion of the lower end 24. The other end is fixed to the pin-fixing structure (9, 10) fixed at the reaction chamber base.

The pin-fixing structure (9, 10) fixed at the reaction chamber base, as explained later in detail, comprises a pin holder 10 and a fixed base member 9. The pin 11, the pin holder 10 and the fixed base member 9 are made of a ceramic material with a relatively small coefficient of thermal expansion such as aluminum oxide (alumina), aluminum nitride, or magnesium oxide and preferably is made of alumina ceramic with high plasma resistance. As a result, length change of the pin 11 in a wide temperature range from room temperature to 600° C. (1112° F.) becomes negligible. At this time, the position of the through-hole 13 of the susceptor 2 and the position of the hole 32 of the fixed base member 9 (that is, the position of the pin 11) becomes negligible.

The semiconductor processing apparatus according to the present invention has three through-holes 13 and substrate-supporting mechanisms (12, 11, 10, 9) corresponding to each hole. According to the aperture of semiconductor to be processed, it is possible to provide more through-holes and substrate-supporting mechanisms.

The semiconductor processing apparatus according to the present invention further includes moving mechanisms (14, 15, 16) for mechanically moving the susceptor 2 vertically. These moving mechanisms comprise a columnar stem 14 which supports the susceptor, an electrically powered running gear 16 and a T-shaped power-transmitting member 15, the horizontal end portion of which is connected to the lower end of the stem 14 and the other end of which is linked to the electrically powered running gear. Between the power transmitting member 15 and the reaction chamber 1, a metal bellows 17 is also provided to prevent particle contamination, which bellows completely separates the reaction chamber 1 from the electrically powered running gear 16 and the power transmitting member 15.

The semiconductor processing apparatus according to the present invention additionally has an opening portion 7 with a gate valve for carrying in and carrying out the semiconductor wafer, an inlet port 5 for bringing in reaction gas in the prescribed amount, a showerhead 4 for spraying the reaction gas on the semiconductor substrate 3 evenly, a radio-frequency oscillator 6 connected to the showerhead for generating radio-frequency plasma in reaction space, and an exhaust port 8 connected to a vacuum exhaust pump (not shown). Because these are well known to people in this trade, further explanation is omitted.

Figure 5:
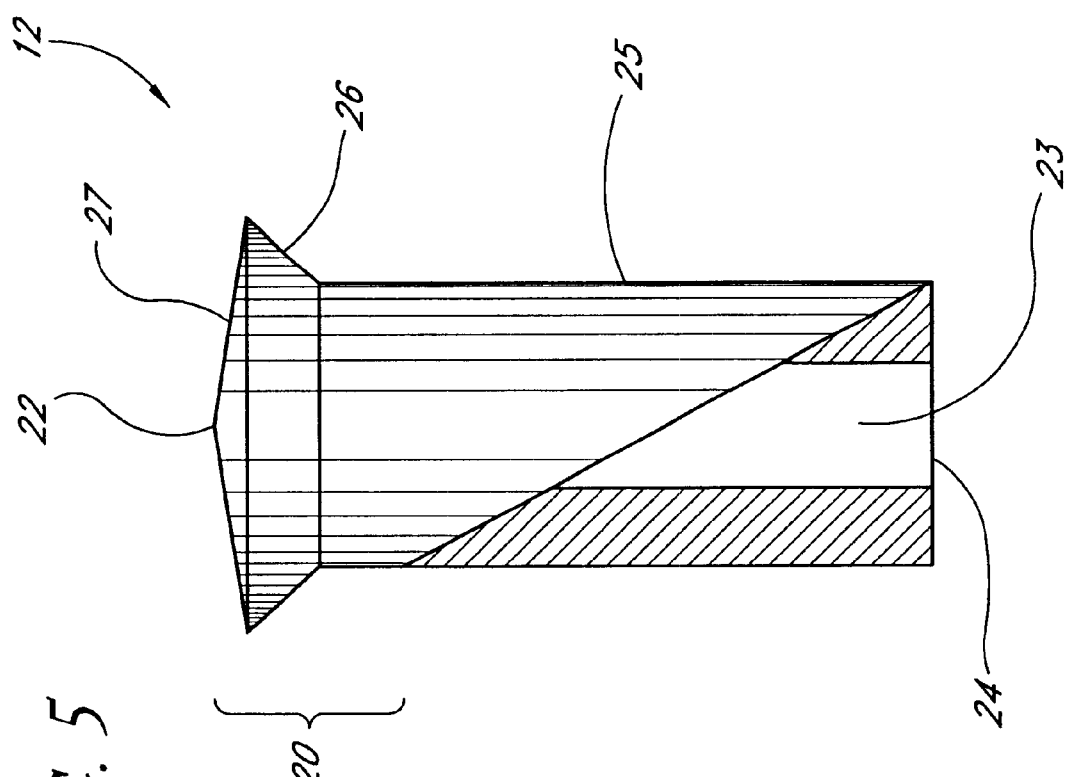
FIG. 5 is a partial cross-sectional view showing a substrate-supporting member according to the present invention.

FIG. 4 is a view showing a partial enlarged cross section of disassembled substrate-supporting mechanisms (12, 11, 10, and 9) according to the present invention. This substrate-supporting mechanism comprises a substrate-supporting member 12, a pin 11, a pin holder 10 and a fixed base member 9. FIG. 5 is a further enlarged view of the substrate-supporting member 12 in FIG. 4. The substrate-supporting member 12 comprises an expanded and projected flanged head member 20 and a cylindrical body portion 25. The head member 20 comprises a conical upper portion 27 and a reverse-truncated cone-shaped conical lower portion 26. The body 25 has an inner cavity 23 in the direction of an axis. The upper end of the cavity 23 has a contact surface 18 and the lower end has an opening portion 24 that opens downward. The tip 19 of the pin 11 is inserted into the opening end 24. The internal diameter of the cavity 23 is also designed slightly larger than an external diameter of the pin 11 so that there is no play when the pin is inserted. Because of this, the pin 11 slides within the cavity.

Figure 6A:
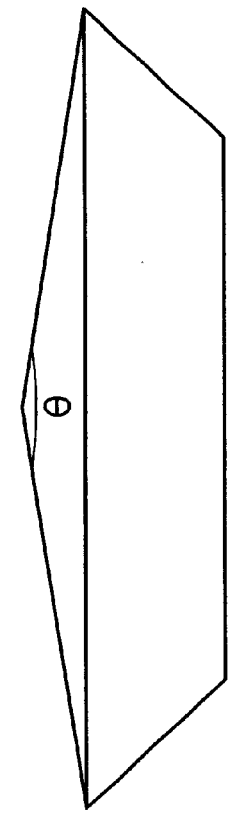
FIGS. 6a, 6b, and 6c are schematic views showing various examples of the head member of a substrate-supporting member according to the present invention.
Figure 6B:
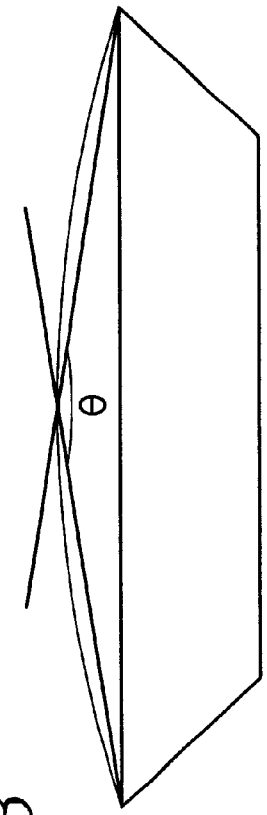
Figure 6C:
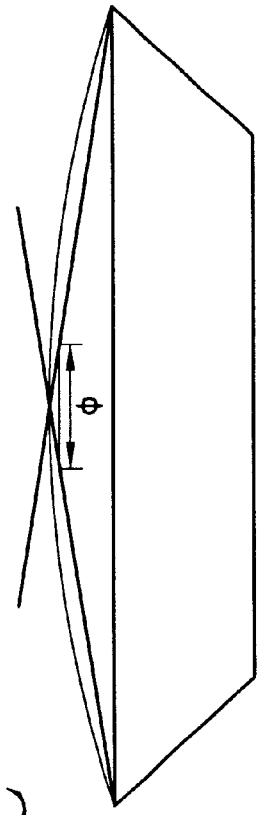

Referring to FIGS. 6a–6c, a variation example of the tip portion 22 of the substrate-supporting member 12 is shown. An interior angle (θ) of a cone portion of the tip portion 22 is designed large enough so that no abnormal discharge is generated from the showerhead 4. The interior angle is preferably $150° \leq \theta \leq 175°$ (FIGS. 6a and 6b). The tip portion 22 can be a circular plane with a designated radius to prevent static electricity attraction to the backside of the substrate (FIG. 6c). At that time, the diameter of the tip portion should be preferably $\phi \leq 1.5$ mm.

Returning to FIG. 4, the internal diameter of the through-hole 13 of the susceptor is designed slightly larger than the external diameter of the substrate-supporting member 12 and the substrate-supporting member 12 slides within the through-hole 13. The lip 21 of the through-hole 13 is beveled at nearly the same angle as that of the curved surface of the lower portion 26 of the head member 20 of the substrate-supporting member 12. Therefore, when the substrate-supporting member 12 is inserted into the through-hole 13, the lower portion 26 of the head member 20 engages with the lip 21 and the substrate-supporting member 12 is supported within the through-hole 13.

Remarkably, when the substrate-supporting member 12 is supported within the through-hole 13 of the susceptor 2 (for example, FIG. 1 or FIG. 2a), the through-hole 13 is completely sealed, the tip portion 22 of the substrate-supporting member 12 is positioned lower than the surface of the susceptor 2, and a gap exists between the tip 19 of the pin 11 and the contact surface 18 of the hollow inner part of the substrate-supporting member 12. Because of this, adjustment of the position of the pin that has been conventionally difficult becomes easier.

Figure 7:
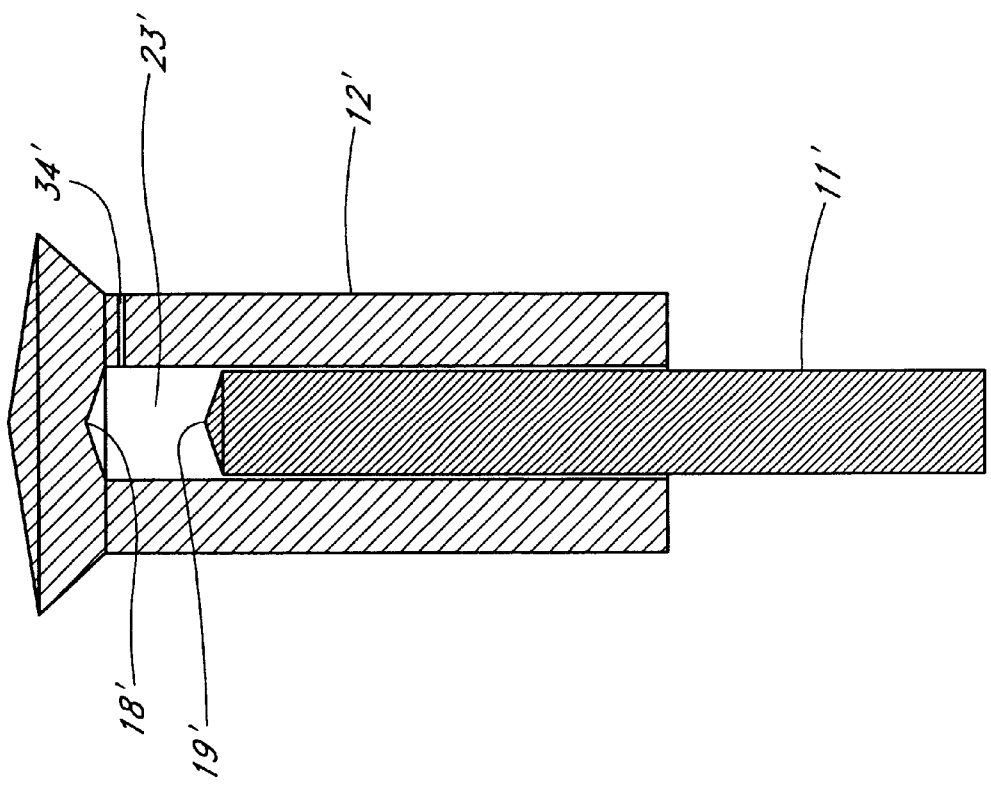
FIG. 7 is a cross-sectional view showing another example of a substrate-supporting member and a pin according to the present invention.

FIG. 7 shows another example of the substrate-supporting member and the pin according to the present invention. A substrate-supporting member 12' has a contact surface 18' that is cut in a cone-shaped at the upper end portion of a cavity 23'. The tip portion 19' of a pin 11' that lifts the substrate-supporting member 12' has nearly the same cone-shaped to engage with the contact surface 18' with no space between them. A hole 34 for gas release can be provided at the wall surface of the substrate-supporting member 12'.

Figure 9A:
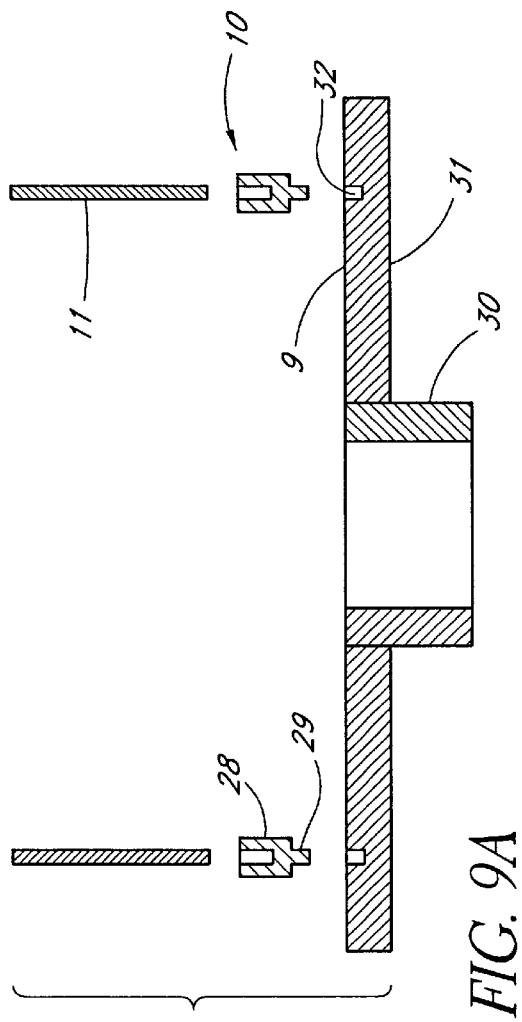
FIGS. 9a and 9b are cross-sectional views showing disassembled/assembled pin-fixing structure according to the present invention.
Figure 9B:
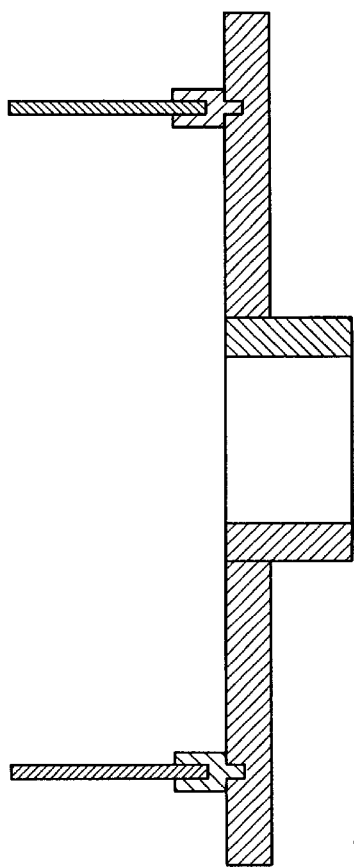

FIG. 8 and FIG. 9 are a plan view and a cross-sectional view showing a pin-fixing structure according to the present invention, respectively. The pin-fixing structure comprises a fixed base member 9 and a pin holder 10.

The fixed base member 9 comprises a center cylindrical portion 30 that the stem 14 of the susceptor 2 goes through and at least three blades 31 radiating in all directions at equal intervals from the upper end periphery portion 33 of the cylindrical par. Around the end of each blade, a threaded hole 32 is provided to receive a pin holder 10. The pin holder 10 comprises a fine cavity 28 for receiving the pin 11 and a screw member 29 threaded to screw in a hole 32 provided at the blade. The pin 11 is connected to the fixed base member via the pin holder 10 screwed into the fixed base member 9. With this, the lower end of the pin is fixed and the upper end of the pin is stabilized with the susceptor's downward movement and the substrate-supporting member 12 can be lifted. Attaching or detaching the pin 11 to or from the pin holder 10 can be achieved easily when the susceptor is at its lowest point (Refer to FIG. 2c) without removing the susceptor 2.

By using the substrate-supporting mechanism according to the present invention, conventional troublesome pin position adjustment has become completely unnecessary. As a result, because there is no concern about abnormal electric discharge at the time of plasma cleaning, yield can be improved and at the same time, work efficiency can improve.

Moreover, by using the substrate-supporting mechanism according to the present invention, the time required for maintenance can be shortened because of easy replacement of expendables, and as a result, productivity can be improved as compared with a conventional method.

Further, by using the substrate-supporting mechanism according to the present invention, a semiconductor wafer with a large aperture can be supported easily, and stable transport can be achieved even when continuous load is imposed. Further, by using the substrate-supporting mechanism according to the present invention, a problem that a pin is electrostatically attracted to the backside of a semiconductor wafer is eliminated, hence concern about particle contamination is also eliminated.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. An apparatus for processing a semiconductor substrate, comprising:

a reaction chamber;

a susceptor within the chamber for supporting a substrate thereon when processed, said susceptor having at least three vertical through-holes at designated positions;

substrate-supporting members slidably fitted in the respective through-holes, each substrate-supporting member being hollow and having an upper closed end and a lower open end, each substrate-supporting member being reciprocally slidable along the through-hole between an upper position where the upper end protrudes from the susceptor and a lower position where the upper end does not protrude from the susceptor, wherein when the substrate-supporting members are at the upper position, the substrate is supported apart from the susceptor by the upper ends of the substrate-supporting members; and pins corresponding to the respective substrate-supporting members, each pin having an upper end, each pin being slidably fitted in the hollow of the substrate-supporting member, said upper end being inserted in the hollow of the substrate-supporting member and pushing upward the substrate-supporting member to move the substrate-supporting member to the upper position by movement of the susceptor relative to the pins, the upper end of each pin being detached from the closed end of the substrate-supporting member positioned at the lower position by movement of the susceptor relative to the pins.

2. The apparatus according to claim 1, wherein the pins are fixed in the chamber, and the susceptor is vertically movable to move the substrate-supporting members between the upper position and the lower position.

3. The apparatus according to claim 2, further comprising a pin-fixing structure provided at a base of the chamber, wherein each pin has a lower end fixed to the pin-fixing structure.

4. The apparatus according to claim 2, further comprising a moving device for mechanically moving the susceptor vertically.

5. The apparatus according to claim 4, further comprising bellows completely separating the moving device and the chamber.

6. The apparatus according to claim 3, wherein the pin-fixing structure comprises (i) a fixed base member attached to the base of the chamber and (ii) pin holders connected to the fixed base member, wherein the lower ends of the pins are fixed to the respective pin holders.

7. The apparatus according to claim 6, wherein the fixed base member comprises (i) a center cylindrical member and (ii) blades extending in a radial direction from the center cylindrical member, each blade having a threaded hole receiving the pin holder.

8. The apparatus according to claim 7, wherein the pin holder comprises (i) a fine cavity for receiving the lower end of the pin and (ii) a threaded screw member to be screwed into the hole of the blade.

9. The apparatus according to claim 1, wherein the upper end of the pin is conical and the hollow of the substrate-supporting member has an end which is conical and the same shape as the upper end of the pin.

10. The apparatus according to claim 1, wherein each substrate-supporting member comprises (i) a flanged head member and (ii) a cylindrical body to receive the upper end of the pin and the other end of said body is closed to contact one end of said pin.

11. The apparatus according to claim 10, wherein the head member comprises (i) a conical top portion and (ii) reverse-truncated cone-shaped lower portion.

12. The apparatus according to claim 11, wherein each through-hole of the susceptor has an upper opening circumference portion which is beveled to fit the reverse-truncated cone-shaped lower portion therein to leave no space between the upper opening circumference portion and the reverse-truncated cone-shaped lower portion when the substrate-supporting member is at the lower position.

13. The apparatus according to claim 1, wherein the pins are vertically positioned wherein the axis of each substrate-supporting member is aligned with the axis of the corresponding pin.

14. The apparatus according to claim 13, wherein the substrate-supporting members have a length such that the lower ends of the substrate-supporting members do not protrude from lower ends of the through-holes of the susceptor when at the lower position.

15. The apparatus according to claim 1, wherein the substrate-supporting members and the pins are made of a material which has high heat resistance with a low coefficient of thermal expansion.

16. The apparatus according to claim 15, wherein the material is ceramic.

17. The apparatus according to claim 15, wherein the material is aluminum oxide or aluminum nitride.

18. A method for processing a substrate using an apparatus comprising:

(i) a reaction chamber; (ii) a susceptor within the chamber, said susceptor having at least three vertical through-holes at designated positions; (iii) substrate-supporting members slidably fitted in the respective through-holes, each substrate-supporting member being hollow and having an upper closed end and a lower open end, each substrate-supporting member being reciprocally slidable along the through-hole between an upper position where the upper end protrudes from the susceptor and a lower position where the upper end does not protrude from the susceptor, wherein when the substrate-supporting members are at the upper position, the substrate is supported apart from the susceptor by the upper ends of the substrate-supporting members; and (iv) pins corresponding to the respective substrate-supporting members, each pin having an upper end, each pin being slidably fitted in the hollow of the substrate-supporting member, said upper end being inserted in the hollow of the substrate-supporting member and pushing upward the substrate-supporting member to move the substrate-supporting member to the upper position by movement of the susceptor relative to the pins, the upper end of each pin being detached from the closed end of the substrate-supporting member positioned at the lower position by movement of the susceptor relative to the pins, said method comprising:

loading a substrate in the reaction chamber, wherein the substrate is supported apart from the susceptor by the substrate-supporting members at the upper position;

moving downward the substrate-supporting members to the lower position by movement of the pins relative to the susceptor, wherein the substrate is placed on the susceptor;

processing the substrate;

moving upward the substrate-supporting members to the upper position by movement of the pins relative to the susceptor, wherein the substrate is supported apart from the susceptor by the substrate-supporting members at the upper position; and unloading the processed substrate from the chamber.

19. The method according to claim 18, further comprising cleaning the chamber when the substrate-supporting member are at the lower position.

20. The method according to claim 18, wherein the vertical movement of the substrate-supporting members relative to the susceptor is conducted by vertically moving the susceptor whereas the pins are held still.

\* \* \* \* \*